(12) United States Patent
Choi

(10) Patent No.: US 7,396,737 B2
(45) Date of Patent: Jul. 8, 2008

(54) METHOD OF FORMING SHALLOW TRENCH ISOLATION

(75) Inventor: Jong-Woon Choi, Seongnam (KR)

(73) Assignee: Dongbu Electronics Co., Ltd., Seoul (KR)

( * ) Notice: Subject to any disclaimer, the term of this patent is extended or adjusted under 35 U.S.C. 154(b) by 73 days.

(21) Appl. No.: 11/319,710

(22) Filed: Dec. 29, 2005

(65) Prior Publication Data

US 2007/0087517 A1    Apr. 19, 2007

(30) Foreign Application Priority Data

Oct. 13, 2005    (KR) ...................... 10-2005-0096558

(51) Int. Cl.
| | |
|---|---|
| H01L 21/8238 | (2006.01) |
| H01L 21/336 | (2006.01) |
| H01L 21/76 | (2006.01) |
| H01L 21/4763 | (2006.01) |
| H01L 21/311 | (2006.01) |
| H01L 21/302 | (2006.01) |

(52) U.S. Cl. .............. 438/424; 257/E21.243; 257/E21.546; 257/E21.244; 438/221; 438/296; 438/424; 438/637; 438/700; 438/704; 438/733

(58) Field of Classification Search ............... 438/424, 438/221, 296, 700, 704, 733, 637; 257/E21.243, 257/E21.546, E21.244

See application file for complete search history.

(56) References Cited

U.S. PATENT DOCUMENTS

| 5,173,439 | A | * | 12/1992 | Dash et al. ................. 438/424 |
|---|---|---|---|---|
| 5,521,422 | A | * | 5/1996 | Mandelman et al. ........ 257/510 |
| 5,665,622 | A | * | 9/1997 | Muller et al. ............... 438/243 |
| 6,194,285 | B1 | * | 2/2001 | Lin et al. ..................... 438/424 |
| 6,245,637 | B1 | * | 6/2001 | Tsai ............................ 438/421 |
| 6,337,262 | B1 | * | 1/2002 | Pradeep et al. ............. 438/574 |
| 6,541,342 | B2 | * | 4/2003 | Choi ........................... 438/296 |
| 6,777,725 | B2 | * | 8/2004 | Willer et al. ................ 257/244 |
| 2002/0160578 | A1 | * | 10/2002 | Choi ........................... 438/424 |
| 2005/0037524 | A1 | * | 2/2005 | Matsumoto et al. ........... 438/14 |
| 2006/0284225 | A1 | * | 12/2006 | Popp et al. .................. 257/296 |

* cited by examiner

*Primary Examiner*—Steven Loke
*Assistant Examiner*—Arman Khosraviani
(74) *Attorney, Agent, or Firm*—Lowe Hauptman Ham & Berner LLP

(57) ABSTRACT

A method of manufacturing a semiconductor device including forming a pad oxide layer on a semiconductor substrate, forming a spacer oxide layer pattern on sidewalls of the pad oxide layer, and forming a nitride layer on the pad oxide layer. The method further includes forming a groove in the nitride layer by selectively removing the spacer oxide layer pattern, forming a trench in a region where the groove is formed, and filling the trench with a thermal oxide layer so as to form a shallow trench isolation (STI) layer. In the method, the line width of the STI layer depends on the thickness of the spacer oxide layer, and so the STI layer can be formed to a line width W smaller than a design rule.

5 Claims, 4 Drawing Sheets

METHOD OF FORMING SHALLOW TRENCH
ISOLATION

CROSS-REFERENCE TO RELATED
APPLICATION

This application claims priority to and the benefit of Korean Patent Application No. 10-2005-0096558 filed in the Korean Intellectual Property Office on Oct. 13, 2005, the entire contents of which are incorporated herein by reference.

BACKGROUND OF THE INVENTION (a) Field of the Invention

The present invention relates to a method of manufacturing a semiconductor device. More particularly, the present invention relates to a method of forming shallow trench isolation (STI) in a semiconductor device.

(b) Description of the Related Art

Recently, as a metal-oxide-semiconductor (MOS) transistor has become highly integrated, a conventional local oxidation of silicon (LOCOS) process has been replaced with a shallow trench isolation (STI) process.

In a typical STI process, a trench is formed by etching a silicon substrate using a silicon nitride pattern formed on the silicon substrate. Subsequently, an insulation layer is formed on the trench and the silicon nitride pattern, which is then planarized by a chemical mechanical polishing (CMP) process so as to expose the silicon nitride pattern. Finally, the silicon nitride pattern is removed to expose the silicon substrate, so that a field insulation layer, that is an STI layer, is formed.

However, in such an STI layer, a line width thereof depends on a design rule of the photolithography and etching processes, and so an STI layer having a smaller line width than the design rule cannot be formed.

The above information disclosed in this Background section is only for enhancement of understanding of the background of the invention and therefore it may contain information that does not form part of the prior art with respect to the present invention.

SUMMARY OF THE INVENTION

The present invention has been made in an effort to provide a method of manufacturing a semiconductor device having the advantage of forming a shallow trench isolation (STI) layer having a smaller line width than the design rule.

An exemplary method of manufacturing a semiconductor device according to an embodiment of the present invention includes forming a pad oxide layer on a semiconductor substrate, forming a spacer oxide layer pattern on sidewalls of the pad oxide layer, forming a nitride layer on the pad oxide layer, forming a groove in the nitride layer by selectively removing the spacer oxide layer pattern, forming a trench in a region where the groove is formed, and filling the trench with a thermal oxide layer so as to form a shallow trench isolation (STI) layer.

In a further embodiment, the formation of a spacer oxide layer pattern can include forming a nitride layer pattern on the pad oxide layer, forming an oxide layer on the nitride layer pattern, and forming a spacer layer pattern by anisotropically etching the oxide layer.

The spacer oxide layer pattern can be formed on sidewalls of the nitride layer pattern.

The exemplary method of manufacturing a semiconductor device can further include forming a groove in the pad oxide layer under the groove in the nitride layer, after forming the groove in the nitride layer. In addition, the exemplary method of manufacturing a semiconductor device can further include filling the groove in the pad oxide layer, after forming the spacer layer pattern.

The exemplary method of manufacturing a semiconductor device can further include removing the nitride layer so as to expose a pad oxide layer.

The nitride layer pattern can be formed on an active region in which a MOS transistor will be formed.

The pad oxide layer can be formed to a thickness of 5-15 nm, the nitride layer pattern can be formed to a thickness of 50-150 nm, and the oxide layer on the nitride layer pattern can be formed to a thickness of 20-40 nm.

Figure 1:
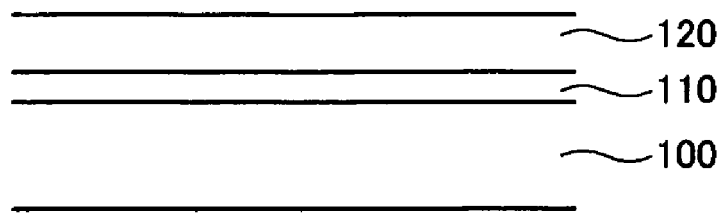
FIG. 1 to FIG. 8 are cross-sectional views showing principal stages of a semiconductor device according to an exemplary embodiment of the present invention.

DETAILED DESCRIPTION OF THE
EMBODIMENT

An exemplary embodiment of the present invention will hereinafter be described in detail with reference to the accompanying drawings. As those skilled in the art would realize, the described embodiment may be modified in various different ways, all without departing from the spirit or scope of the present invention.

To clarify multiple layers and regions, the thicknesses of the layers are enlarged in the drawings. Like reference numerals designate like elements throughout the specification. When it is said that any part, such as a layer, film, area, or plate, is positioned on another part, it means the part is directly on the other part or above the other part with at least one intermediate part. On the other hand, if any part is said to be positioned directly on another part it means that there is no intermediate part between the two parts.

Now, an exemplary semiconductor device and method of manufacturing the same according to an embodiment of the present invention will hereinafter be described in detail with reference to the accompanying drawings.

FIG. 1 to FIG. 8 are cross-sectional views showing principal stages of a semiconductor device according to an exemplary embodiment of the present invention.

Firstly, as shown in FIG. 1, a pad oxide layer 110 is formed on a semiconductor (e.g., silicon) substrate 100 to a predetermined thickness of 5-15 nm. In addition, a first nitride layer 120 is formed on the pad oxide layer 110 to a predetermined thickness of 50-150 nm.

Figure 2:
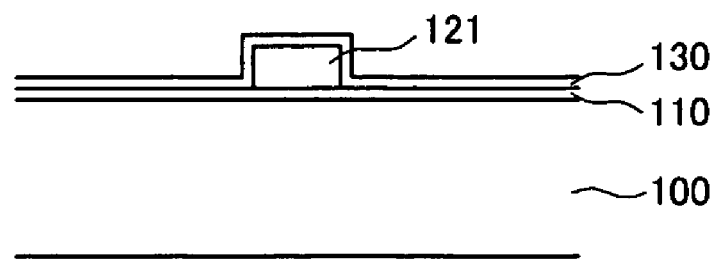

Subsequently, as shown in FIG. 2, the first nitride layer 120 is patterned to a nitride layer pattern 121. In addition, a spacer oxide layer 130 is formed on the nitride layer pattern 121 to a predetermined thickness of 20-40 nm.

Figure 3:
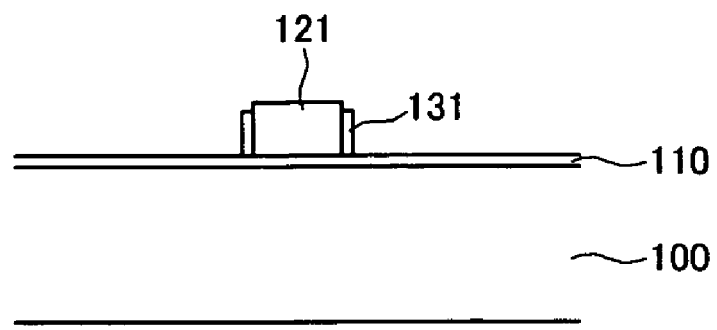

Subsequently, as shown in FIG. 3, the spacer oxide layer 130 is anisotropically etched without an etching mask. Consequently, only a spacer oxide layer pattern 131 on sidewalls of the nitride layer pattern 121 remain, while the rest of the spacer oxide layer 130 is removed.

Figure 4:
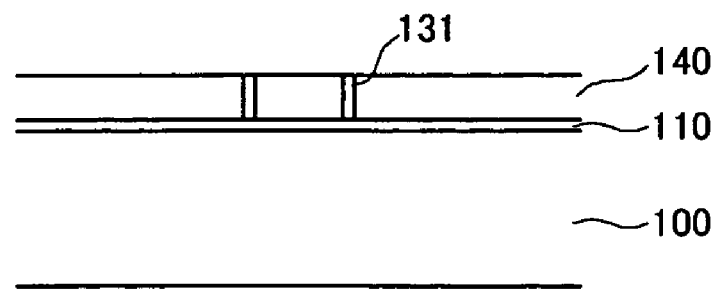

Subsequently, as shown in FIG. 4, the nitride layer pattern 121 is removed so as to leave the spacer oxide layer pattern 131. The spacer oxide layer pattern 131 can be formed on the pad oxide layer 110 as sidewalls. In addition, a second nitride layer 140 can be formed on the spacer oxide layer pattern 131 and the pad oxide layer 110. In addition, the second nitride layer 140 is polished by chemical mechanical polishing (CMP) to expose the spacer oxide layer pattern 131.

Figure 5:
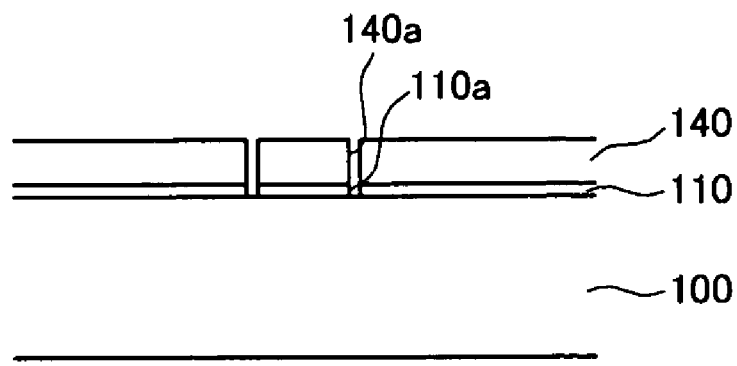

Subsequently, as shown in FIG. 5, the spacer oxide layer pattern 131 is wet-etched to expose the pad oxide layer 110 underneath. Thereby, a groove 140a in the second nitride layer 140 is formed at a position where the spacer oxide layer pattern 131 was removed. The exposed pad oxide layer 110 is wet-etched to expose the semiconductor substrate 100. Thereby, a groove 110a is formed in the pad oxide layer 110.

Figure 6:
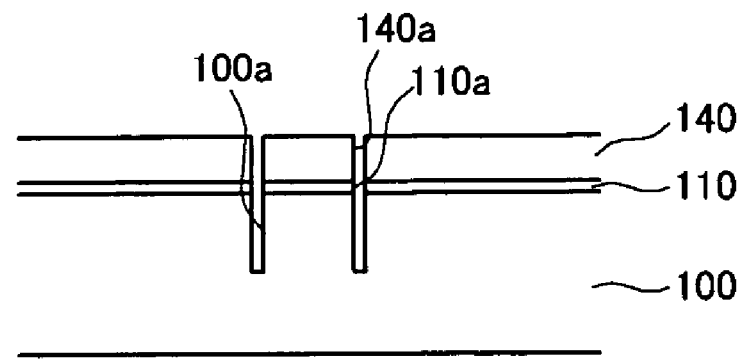

Subsequently, as shown in FIG. 6, an etching process using the groove 110a in the pad oxide layer 110 is performed to form a trench 100a in the semiconductor substrate 100.

Figure 7:
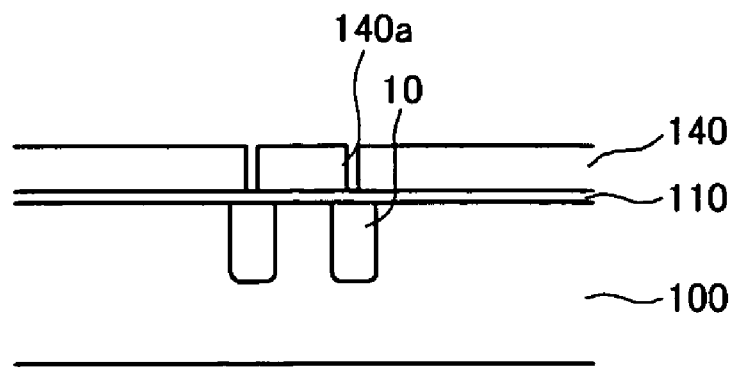

As shown in FIG. 7, a thermal oxidation process follows so as to form a trench oxide layer 10 on the sidewall of the trench 100a. The trench oxide layer 10 acts as a STI layer that isolates a device. The STI layer 10 can be formed to a line width W smaller than a design rule, which is a minimum line width that can be realized with a typical photolithography and etching process. The STI layer 10 can be formed by using a rapid thermal annealing (RTP) apparatus or a furnace, and so it can have excellent quality compared to a deposited oxide layer. Therefore, the characteristics of device isolation can be improved.

Figure 8:
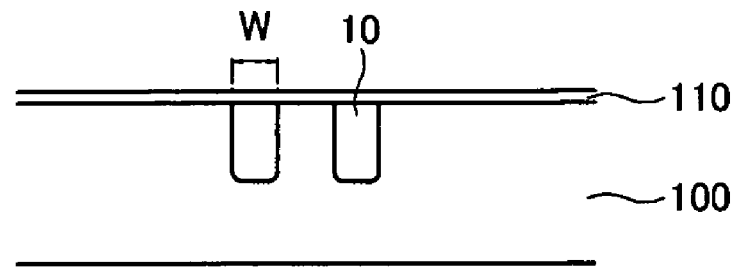

Subsequently, as shown in FIG. 8, the second nitride layer 140 on the pad oxide layer 110 is removed by wet-etching using a phosphoric acid solution that has a high selectivity between a nitride layer and an oxide layer.

In an exemplary method of manufacturing a semiconductor device according to an embodiment of the present invention, the line width of the STI layer depends on the thickness of the spacer oxide layer, so the STI layer can be formed to a line width W smaller than a design rule.

In addition, since the line width of the STI layer can be formed narrower, so the semiconductor device can be highly integrated.

While this invention has been described in connection with what is presently considered to be a practical exemplary embodiment, it is to be understood that the invention is not limited to the disclosed embodiment, but, on the contrary, is intended to cover various modifications and equivalent arrangements included within the spirit and scope of the appended claims.

What is claimed is:

1. A method of manufacturing a semiconductor device, comprising:
    forming a pad oxide layer on a semiconductor substrate;
    forming a nitride layer pattern on the pad oxide layer;
    forming a spacer oxide layer pattern on the side wall of the nitride layer pattern;
    removing the nitride layer pattern so as to expose the spacer oxide layer pattern and the pad oxide layer;
    forming a nitride layer on the spacer oxide layer pattern and the pad oxide layer;
    forming a groove in the nitride layer by selectively removing the spacer oxide layer pattern;
    forming a trench in a region of the semiconductor substrate where the groove is formed above the region of the semiconductor substrate; and
    filling the trench with a thermal oxide layer so as to form a shallow trench isolation (STI) layer,
    wherein the formation of the spacer oxide layer pattern comprises:
    forming an oxide layer on the nitride layer pattern; and
    forming a spacer oxide layer pattern by anisotropically etching the oxide layer.

2. The method of claim 1, wherein the pad oxide layer is formed to a thickness of 5-15 nm.

3. The method of claim 1, wherein the nitride layer pattern is formed to a thickness of 50-150 nm.

4. The method of claim 1, wherein the oxide layer on the nitride layer pattern is formed to a thickness of 20-40 nm.

5. The method of claim 1, wherein the pad oxide layer is formed to a thickness of 5-15 nm, the nitride layer pattern is formed to a thickness of 50-150 nm, and the oxide layer on the nitride layer pattern is formed to a thickness of 20-40 nm.

* * * * *